(12) United States Patent
Ueda

(10) Patent No.: US 6,750,108 B2
(45) Date of Patent: Jun. 15, 2004

(54) METHOD FOR MANUFACTURING A SEMICONDUCTOR DEVICE

(75) Inventor: Takashi Ueda, Yamatokoriyama (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 10/062,492

(22) Filed: Feb. 5, 2002

(65) Prior Publication Data
US 2002/0119630 A1 Aug. 29, 2002

(30) Foreign Application Priority Data
Feb. 26, 2001 (JP) ........................ 2001-049596

(51) Int. Cl.⁷ ............................ H01L 21/336
(52) U.S. Cl. ............... 438/303; 438/592; 438/927
(58) Field of Search ........................ 438/592, 926, 438/301, 303, 305, 289, 291, 951

(56) References Cited

U.S. PATENT DOCUMENTS 5,079,180 A * 1/1992 Rodder et al. ............ 438/297
6,063,675 A * 5/2000 Rodder ..................... 438/291
2002/0037619 A1 * 3/2002 Sugihara et al. ........... 438/289

FOREIGN PATENT DOCUMENTS

JP 10-189966 7/1998

* cited by examiner

Primary Examiner—Richard A. Booth
(74) Attorney, Agent, or Firm—Nixon & Vanderhye, P.C.

(57) ABSTRACT

A method for manufacturing a semiconductor device comprises:

(a) forming a dummy gate provided with a sidewall spacer at its side wall and an anti-silicidation film thereon on a semiconductor substrate, as well as forming a source/drain region on the surface of the semiconductor substrate;

(b) forming a metal film on the whole surface of the obtained semiconductor substrate, the resultant being subject to a silicide reaction to form a silicide layer only on the source/drain region;

(c) forming an interlayer dielectric film on the obtained substrate, the surface of the interlayer dielectric film being removed until the anti-silicidation film is exposed;

(d) removing the anti-silicidation film and the dummy gate to form a trench in the interlayer dielectric film; and (e) laminating a gate insulating film and gate electrode material film in the trench, the gate insulating film and gate electrode material film being removed until the surface of the interlayer dielectric film is exposed to form a gate electrode and gate insulating film in the trench.

7 Claims, 4 Drawing Sheets

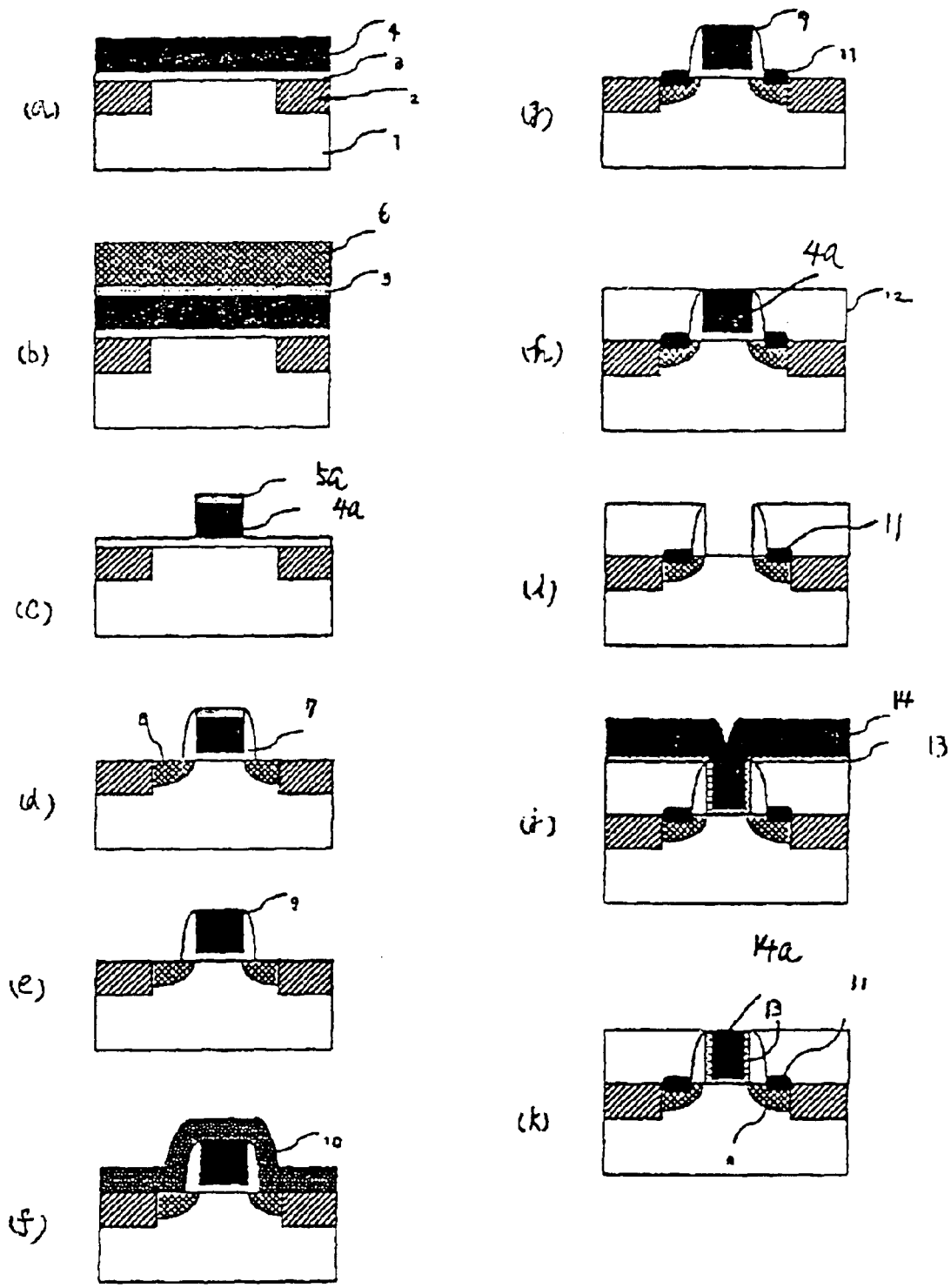
[FIG. 1]

[FIG. 2]
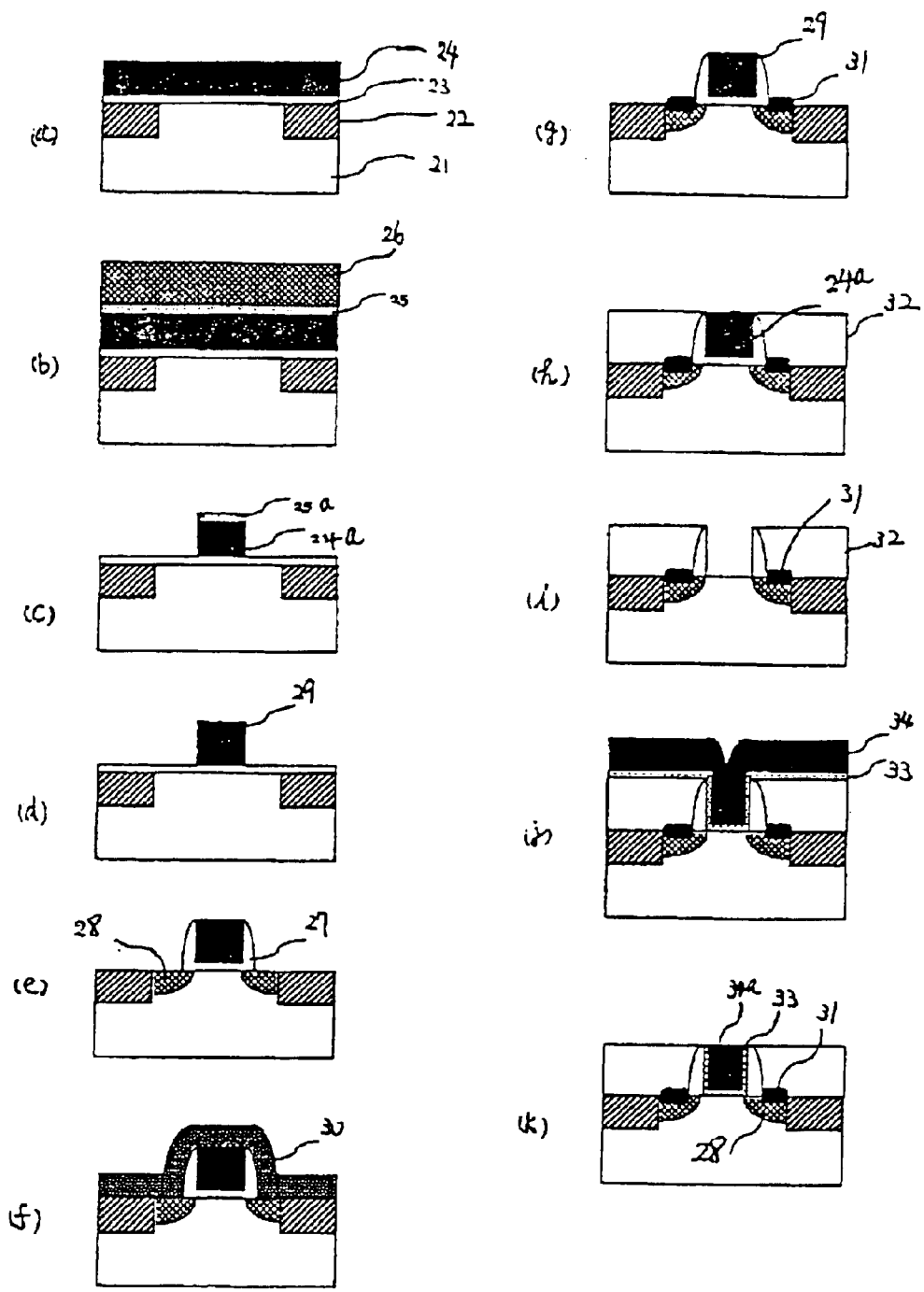

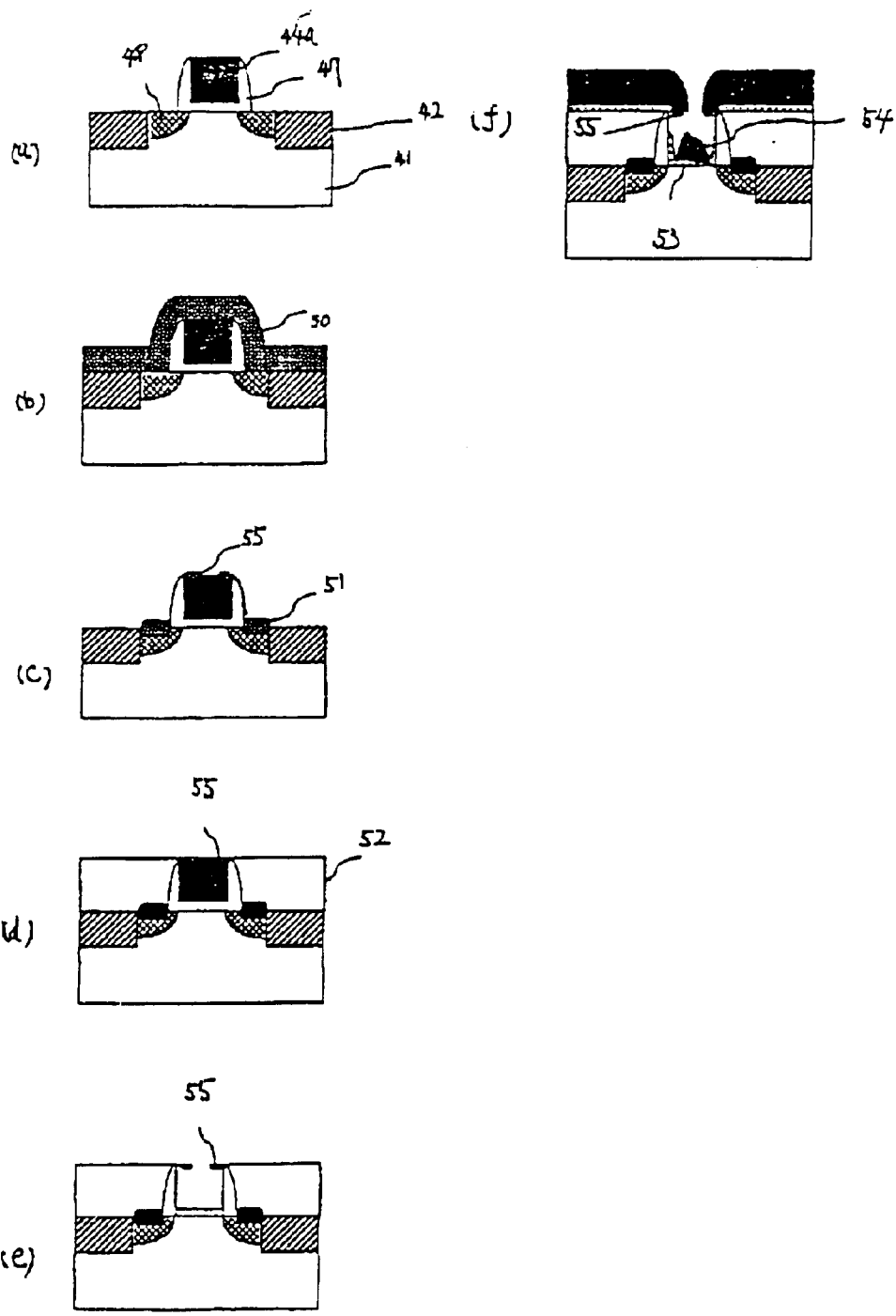
[FIG. 3]

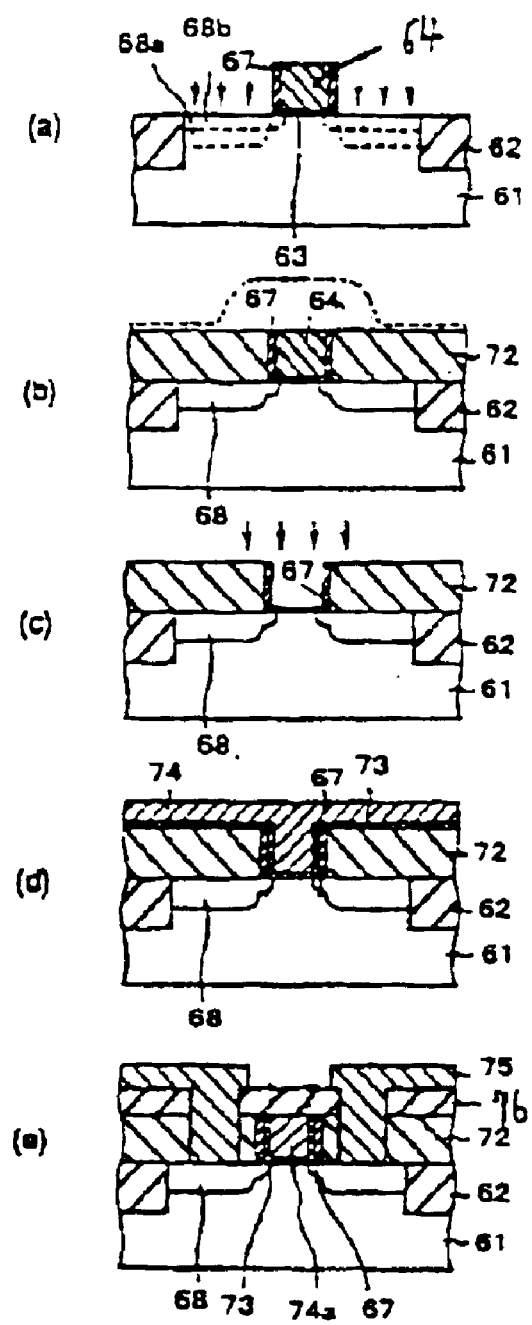
[FIG. 4]

US 6,750,108 B2

METHOD FOR MANUFACTURING A SEMICONDUCTOR DEVICE

CROSS-REFERENCE TO RELATED APPLICATION

This application is related to Japanese application No. 2001-049596 filed on Feb. 26, 2001, whose priority is claimed under 35 USC § 119, the disclosure of which is incorporated by reference in its entirety.

BACKGROUND OF THE INVENTION

1. Field of the Invention

The present invention relates to a method for manufacturing a semiconductor device. More particularly to a method for manufacturing a semiconductor device utilizing a silicidation process and a dummy gate process.

2. Description of the Prior Arts

When a gate length is reduced as a MOS transistor is made subminiaturized and made to have a high precision, there arises a problem of the deterioration in the performance of a transistor with the increase in wiring resistance of a gate electrode.

Conventional transistors utilize a dummy gate 64 as shown in FIGS. 3(a) to 3(e). Specifically, Japanese Unexamined Patent Application No. HEI10-189966 discloses a technique for replacing the dummy gate electrode 64 with a metal gate electrode 74a after forming diffusion layers 68a and 68b.

As shown in FIG. 3(a), a trench is firstly formed in a Si-substrate 61 by using an RIE technique, and then, an insulating film is embedded into the trench to form a device isolation layer 62. Subsequently, an $SiO_2$ film 63 having a thickness of about 5 nm is formed on which a nitride film for the dummy gate electrode pattern 64 is then entirely deposited with a thickness of about 300 nm. The nitride film is patterned to form the dummy gate electrode pattern 64. An ion implantation is performed with the dummy gate pattern 64 as a mask for forming the diffusion layer 68b which serves as an LDD region. Thereafter, a sidewall spacer 67 is formed at the side wall of the dummy gate pattern 64. The ion implantation is performed with these dummy gate pattern 64 and sidewall spacer 67 as masks thereby forming the diffusion layer 68a.

An CVD-$SiO_2$ film 72 is deposited on the whole surface of the obtained Si-substrate 61, followed by a thermal treatment to cause an activation of the implanted ion thereby forming a source/drain region 68. Thereafter, the CVD-$SiO_2$ film 72 is planarized by a CMP method as shown in FIG. 3(b) thereby exposing the surface of the nitride film serving as the dummy gate pattern 64.

Next, the exposed dummy gate pattern 64 is selectively removed as shown in FIG. 3(c) thereby exposing each surface of sidewall spacer 67 and $SiO_2$ film 63. Then, a channel ion implantation is performed to a desired channel region with a resist film (not shown), CVD-$SiO_2$ film 72 and the sidewall spacer 67 as masks.

Subsequently, the $SiO_2$ film 63 is removed as shown in FIG. 3(d), a gate insulating film 73 and a metal film 74 are deposited onto the whole surface of the obtained Si-substrate 61.

Then, the whole surface of the obtained Si-substrate 61 is polished as shown in FIG. 3(e) with the CMP method thereby embedding the metal film 74 and the gate insulating film 73 into the trench from which the dummy gate pattern 64 has been removed, resulting in forming a gate electrode 74a are formed. An interlayer dielectric film 76 is deposited onto the whole surface of the obtained Si-substrate 61. Contact holes which extend to the full depth of the source/drain region 68 and the gate electrode 74a. An Al film is deposited onto the interlayer dielectric film 76 including the contact hole, and then, a patterning is executed to form a wiring 75.

The above-mentioned dummy gate process (replacement process of the dummy gate electrode with a metal gate electrode) can avoid the increase in wiring resistance of the gate electrode, deterioration at the edge portion of the gate insulating film or the like.

On the other hand, the diffusion layer represented by the source/drain region has a shallow junction depth with a sub-miniaturization, that causes an increase in wiring resistance. However, this problem has generally been solved by using a salicide technique. This salicide technique is to deposit a transition metal of Group VIII element such as Ti, Co, Ni or the like on the source/drain region of an active region and on polycrystalline silicon serving as the gate electrode, wherein a silicidation reaction is utilized between the silicon and the metal by a thermal treatment. It is one of the important techniques from the viewpoint of reducing the resistance of the diffusion layer of the source/drain region and the resistance of the gate electrode wiring.

Accordingly, this salicide technique is expected to be adapted to the dummy gate process.

For example, formed on a Si-substrate 41 having an isolation film 42 formed thereon are a dummy gate electrode 44a, source/drain region 48 and sidewall spacer 47 as shown in FIG. 4(a). Silicon nitride or polycrystalline silicon is used for the material of the dummy gate electrode 44a from the viewpoint of the simple use in the process and cost.

Subsequently, a metal film 50 that becomes a silicide material is deposited on the whole resultant surface as shown in FIG. 4(b).

Then, the obtained Si-substrate 41 is subject to a thermal treatment to cause the silicide reaction on the surface of the source/drain region 48, thereby forming a metal silicide layer 51. Thereafter, the unreacted metal film 50 is removed by an acid cleaning including sulfuric acid. The silicon nitride or polycrystalline silicon used as the material for the dummy gate electrode 44a is active with respect to the metal film 50 that becomes the silicide material, so that the dummy gate electrode 44a is silicide-reacted with the metal film 50 thereby forming a metal silicide layer 55 on the surface of the dummy gate electrode 44a.

Next, an interlayer dielectric film 52 is deposited, followed by a planarization process with the CMP so as to expose the surface of the dummy gate electrode 44 as shown in FIG. 4(d).

Subsequently, the dummy gate electrode 44a is removed by a wet etching method.

However, the metal silicide layer 55 has a resistance to an etchant comprised of diluted hydrofluoric acid solution or the like, so that it is not completely removed and remains. Accordingly, there arises a problem that the metal silicide layer 55 remains or it impedes the removal of the dummy date electrode 44a as shown in FIG. 4(e), or the remaining metal silicide layer 55 impedes the deposition of the gate insulating film 53 and metal electrode film 54 on the area where the dummy gate electrode is removed as shown in FIG. 4(f).

SUMMARY OF THE INVENTION

The present invention provides a method for manufacturing a semiconductor device comprising:

(a) forming a dummy gate provided with a sidewall spacer at its side wall and an anti-silicidation film thereon on a semiconductor substrate, as well as forming a source/drain region on the surface of the semiconductor substrate;

(b) forming a metal film on the whole surface of the obtained semiconductor substrate, the resultant being subject to a silicide reaction to form a silicide layer only on the source/drain region;

(c) forming an interlayer dielectric film on the obtained substrate, the surface of the interlayer dielectric film being removed until the anti-silicidation film is exposed;

(d) removing the anti-silicidation film and the dummy gate to form a trench in the interlayer dielectric film; and (e) laminating a gate insulating film and gate electrode material film in the trench, the gate insulating film and gate electrode material film being removed until the surface of the interlayer dielectric film is exposed to form a gate electrode and gate insulating film in the trench.

Accordingly, a method for manufacturing a semiconductor device of the present invention is capable of simply and assuredly adapting a silicide technique to a dummy gate process.

BRIEF DESCRIPTION OF THE DRAWINGS

FIGS. 1(a) to 1(k) are schematic sectional process views showing essential parts of an embodiment of a method for manufacturing a semiconductor device according to the present invention;

FIGS. 2(a) to 2(k) are schematic sectional views showing essential parts of another embodiment of a method for manufacturing a semiconductor device according to the present invention;

FIGS. 3(a) to 3(e) are schematic sectional views showing essential parts of a conventional method for manufacturing a semiconductor device; and FIGS. 4(a) to 4(f) are schematic sectional views showing essential parts of another conventional method for manufacturing a semiconductor device.

DESCRIPTION OF THE PREFERRED EMBODIMENT

In a method for manufacturing a semiconductor device of the present invention, a dummy gate provided with a sidewall spacer at its side wall and an anti-silicidation film on its surface is formed on a semiconductor substrate as well as a source/drain region is formed onto the surface of the semiconductor substrate in a step (a).

In order to realize such a method, a dummy gate forming film is generally formed on the semiconductor substrate, and then, this film is subject to a photolithography or an etching process to be patterned to have a desired shape, thereby forming the dummy gate. The dummy gate forming film is not specifically limited. Examples of the film include a conductive film, insulating film or the like, among which polycrystalline silicon, silicon nitride, silicon nitric oxide, SiGe or the like is suitable. The thickness of the dummy gate forming film is suitably adjusted considering the thickness of the gate electrode in the semiconductor device that is expected to be finally obtained. It is preferable that the film capable of preventing a silicidation (anti-silicidation film) as described later is formed on the dummy gate forming film. Examples of the film capable of preventing the silicidation include titanium oxide or the like. The thickness of this film is preferably about 5 to 100 nm. This film can simplify the formation of the dummy gate provided with the anti-silicidation film formed thereon. In case where the semiconductor substrate has a step portion formed thereon, exposure causes a reflection interference of light attributed to the step portion, whereby a transferring pattern may partially be thinned. An anti-reflection film instead of the anti-silicidation film or that can serve as the anti-silicidation film may be formed on the dummy gate forming film for preventing the reflection interference. The anti-reflection film here can utilize organic or inorganic material. Specific examples are titanium nitride or the like. The thickness of this film is preferably about 5 to 50 nm.

Subsequently, a sidewall spacer is formed by a known method, specifically by the formation of the insulating film and etching. A material and thickness of the sidewall spacer can suitably be adjusted depending upon the performance of the semiconductor device to be obtained.

It is preferable that, in case where the anti-reflection film is formed on the dummy gate, the anti-reflection film is oxidized before or after the formation of the side wall spacer to be converted into the anti-silicidation film. The oxidation is preferably performed at a temperature of about 350 to 500° C. Further, a thermal oxidation or a plasma oxidation using oxygen or ozone is preferable. The anti-reflection film is not required to be oxidized to the full length in its depth direction. It may be oxidized by about 5 mm from the surface.

A source/drain region is formed on the obtained semiconductor substrate. The formation of the source/drain region is preferably done with an ion implantation by using the obtained dummy gate and side wall spacer as masks. The conditions of the ion implantation can suitably be adjusted depending upon the performance of the semiconductor device to be obtained.

A metal film is formed on the whole surface of the obtained semiconductor device in a step (b). The metal film is not specifically limited if it can form the silicide. Examples of the metal film include titanium, cobalt, nickel, tungsten, platinum, molybdenum, palladium, tantalum or the like, among which titanium, cobalt and nickel are preferable. The metal film can be formed by a sputtering, vapor-deposition method, EB method or the like with a thickness of about 5 to 100 nm.

The semiconductor substrate on which the metal film is formed is subject to silicide reaction, whereby a silicide layer can be formed only on the source/drain region. The silicide reaction can be performed, for example, at a temperature of about 400 to 800° C. for about 5 seconds to 60 minutes under nitrogen gas atmosphere or under atmosphere by a furnace anneal, lamp anneal, laser anneal or the like. After the silicide reaction, unreacted metal film is removed by a known method, for example, by a wet etching, and then, a thermal treatment is preferably performed for achieving the low resistance of the silicide film as the need arises. The above-mentioned conditions can be adapted to the thermal treatment.

An interlayer dielectric film is formed onto the obtained semiconductor substrate, followed by removing the surface of the interlayer dielectric film until the anti-silicidation film is exposed in a step (c). The interlayer dielectric film can be formed with a sputtering, CVD method or the like as a single-layer film or a laminate structure film by using various materials such as a silicon oxide film, silicon nitride film, SOG, PSG, BPSG or the like. The interlayer dielectric film is preferably formed to have a thickness larger than the total thickness of the dummy gate and the anti-silicidation film. The removal of the interlayer dielectric film can be done with various methods such as a wet etching, dry etching including RIE method or CMP method, among which the CMP method is preferable.

The anti-silicidation film and the dummy gate are removed in a step (d), whereby trenches corresponding to these films can be formed in the interlayer dielectric film. The method for the removal of these films can suitable be selected depending upon the materials used as the anti-silicidation film and the dummy gate. For example, the wet etching is suitable.

A gate insulating film and gate electrode material film are laminated in the trench in a step (e). The gate electrode material film and gate insulating film are removed until the surface of the interlayer dielectric film is exposed, whereby a gate electrode and gate insulating film can be formed in the trench. The gate insulating film is not specifically limited. Examples of this film include a single-layer film or a laminate structure film of an insulating film such as a silicon oxide film, silicon nitride film or the like, a high dielectric film such as $Ta_2O_5$ or $ZrO_2$. A preferable thickness is about 5 to 50 nm. Any material can be used for the gate electrode if it is a conductive film. Examples of the gate electrode include a single-layer film or a laminate structure film of polysilicon; metal such as platinum, aluminum, nickel, copper or the like; metal having high melting point such as titanium, tantalum, cobalt, tungsten or the like; silicides, polycide or the like of these materials. The film for forming the gate electrode is preferably formed to have a thickness larger than the thickness of the interlayer dielectric film already formed. These films can be formed by various methods such as CVD method, sputtering, anode oxidation method or the like.

A semiconductor device can be completed by suitably executing a steps, besides the above-mentioned steps, that is utilized for a manufacturing method of a semiconductor device such as a thermal treatment, formation of an insulating film, formation of a contact hole, formation of a wiring layer or the like.

A method for manufacturing a semiconductor device according to the present invention will be explained hereinbelow with reference to the drawings.

Embodiment 1

Firstly, a dummy gate oxide film 3 and a polycrystalline silicon film 4 serving as a dummy gate electrode are deposited with a thickness of about 200 nm as shown in FIG. 1(a) onto a semiconductor substrate 1 on which a device isolation film 2 is formed.

Subsequently as shown in FIG. 1(b), a titanium nitride film 5 is deposited thereon with a thickness of about 10 nm as an anti-reflection film for preventing the reflection of exposure caused due to a step portion of a front-end, followed by the application of a photo resist film 6 thereon.

Next, the photo resist film 6 is patterned as shown in FIG. 1(c) with a photolithography technique. The titanium nitride film 5 and polycrystalline silicon film 4 are successively etched with a dry etching method as the obtained resist pattern as a mask to thereby be patterned, resulting in forming a titanium nitride film 5a and a dummy gate electrode 4a. After the etching, the photo resist film 6 serving as a mask is treated with oxygen plasma for removal.

Additionally as shown in FIG. 1(d), a silicon oxide film is deposited onto the semiconductor substrate 1 with a thickness of about 100 nm by the CVD method, and then, an etch back is done to the resultant with the dry etching method for forming a sidewall spacer 7 at the side wall of the dummy gate electrode 4a. Thereafter, the thermal anneal treatment is performed at a temperature of 800° C. or below, for example, at 700° C., for the ion implantation and the recovery of the crystal defect in the silicon, whereby a source/drain region 8 is formed. This anneal temperature avoids the reduction at the boundary between the titanium nitride and the polycrystalline silicon.

Subsequently as shown in FIG. 1(e), the obtained semiconductor substrate 1 is maintained under a plasma atmosphere of ozone/oxygen mixture gas of 400° C. for about 10 minutes, thereby converting the titanium nitride film 5a into a titanium oxide film 9 serving as an anti-silicidation film. The surface of the source/drain region 8 is also oxidized at this time, but it is removed by executing later the wet etching treatment using hydrofluoric acid. The titanium oxide film 9 is not etched and thus remains due to a low etching speed by the hydrofluoric acid.

The next process is, as shown in FIG. 1(f), to form a Ti film 10 on the semiconductor substrate 1 with a thickness of about 50 nm by the PVD method.

Thereafter, the semiconductor substrate 1 is subject to the thermal treatment, as shown in FIG. 1(g), to cause the silicide reaction at the surface of the source/drain region 8, whereby a titanium silicide layer 11 is formed. After that, unreacted Ti film 10 is removed by acid cleaning solution including sulfuric acid. The titanium nitride film 5a and the titanium oxide film 9 can restrain the silicidation of the polycrystalline silicon which is the dummy gate electrode 4a under an anneal condition such as at a low temperature for the silicidation, since each of these films has a reactivity with silicon smaller that of metal titanium. The titanium oxide film 9 is partially etched upon the removal and cleaning of the unreacted Ti film 10, but to a degree that does not matter for the device.

Subsequently, a silicon oxide film 12 is deposited, shown in FIG. 1(h), with a thickness of about 1500 nm by using the CVD method, followed by polishing the resultant by the CMP method until the surface of the dummy gate electrode is exposed. The CMP method has a difficulty to terminate the polishing process at the time when the surface of the dummy gate electrode appears, while it has an advantage of enhancing the polishing selectivity between the silicon oxide film 12 and the gate electrode material. Specifically, the selectivity is enhanced by, for example, selecting a polishing cloth in the CMP apparatus or polishing agent introduced during the process. Using a general silica type polishing agent brings a ratio of several hundred of the polishing selectivity of the titanium oxide to the silicon oxide. This ratio is very high compared to polishing selectivity of 1 or less of the silicon oxide to the polycrystalline silicon or the polishing selectivity of 4 or less of the oxide silicon to the silicon nitride, whereby the end point of the process by the CMP can be detected.

In this way, the formation of the titanium oxide film 9 facilitates the detection of the polishing termination in the CMP, with the result that the gate electrode can be made thin or the fluctuation in the polishing amount of the silicon oxide film 12 can be reduced.

Thereafter, the titanium oxide film 9 is dissolved to be removed by using concentrated sulfuric acid, while the dummy gate electrode 4a is removed by using an acid mixture of hydrofluoric acid—nitric acids thereby forming a trench in the silicon oxide film 12 as shown in FIG. 1(i).

Then, a high dielectric gate film 13 and a metal gate electrode material 14 are deposited on the obtained semiconductor substrate 1, as shown in FIG. 1(g), by using a $Ta_2O_5$ film having a thickness of about 5 nm.

Subsequently, the high dielectric gate film 13 and the metal gate electrode material 14 are polished, as shown in FIG. 1(k), with the CMP method until the surface of the silicon oxide film 12 is exposed, whereby the high dielectric gate film 13 and a metal gate electrode 14a are formed in the trench.

The formation of a protecting film, formation of the contact hole, formation of the metal wiring or other processes are then executed to complete the semiconductor device.

Embodiment 2

The titanium nitride film 5a and the dummy gate electrode 4a are formed on the semiconductor substrate 1 having the device isolation film 2 formed thereon by the same manner as in the Embodiment 1 as shown in FIGS. 2(a) to (c).

Subsequently, the obtained semiconductor substrate 1 is maintained under a plasma atmosphere of ozone/oxygen mixing gas of 400° C. for 10 minutes, thereby converting the titanium nitride film 5a into the titanium oxide film 9 as shown in FIG. 2(d).

Next, the sidewall insulating film 7 is formed by the same manner as in the Embodiment 1, followed by the formation of the source/drain region 8 with the ion implantation as shown in FIG. 2(e).

Then, the Ti film 30 is formed on the obtained semiconductor substrate 1 by the same manner as in the Embodiment 1 as shown in FIG. 2(f)

Thereafter, the semiconductor device is completed by the same manner as in the Embodiment 1 as shown in FIGS. 2(g) to (k).

According to the present invention, the formation of the silicide film can promote to reduce the resistance of the source/drain region as well as can prevent the silicidation of the dummy gate electrode, whereby the dummy gate process can easily and assuredly be carried out.

Further, the titanium oxide used as a barrier for preventing the silicide reaction is formed by oxidizing the titanium nitride deposited as the anti-reflection film in the photo-alignment process, so that the film for preventing the silicide reaction is not required to be newly formed. This can improve the process precision of the photo-alignment.

Additionally, the precision for detecting the end point in the CMP method can be enhanced upon planarizing the interlayer dielectric film, thereby achieving a stabilized processing.

What is claimed is:

1. A method for manufacturing a semiconductor device comprising:

(a) forming a dummy gate provided with a sidewall spacer at its side wall and an anti-silicidation film thereon on a semiconductor substrate, as well as forming a source/drain region on the surface of the semiconductor substrate;

(b) forming a metal film on the whole surface of the obtained semiconductor substrate, the resultant being subject to a suicide reaction to form a suicide layer only on the source/drain region;

(c) removing the anti-silicidation film and the dummy gate to form a trench; and (d) forming a gate insulating film and gate electrode material film in the trench to form a gate electrode and gate insulating film in the trench;

wherein the step (a) comprises the steps of:
   forming a film for forming the dummy gate, anti-reflection film and a resist film on the semiconductor substrate;
   patterning the resist film;
   forming the dummy gate by etching the film for forming the dummy gate with the obtained resist film as a mask;
   removing the resist film;
   oxidizing the anti-reflection film to convert it into the anti-silicidation film;
   forming the sidewall spacer at the side wall of the obtained dummy gate before or after the conversion; and
   forming the source/drain region on the semiconductor substrate.

2. A method claimed in claim 1, wherein the anti-silicidation film is a titanium oxide.

3. A method claimed in claim 1, wherein the anti-reflection film is a titanium nitride.

4. A method claimed in claim 1, wherein the process for oxidizing the anti-reflection film is a thermal oxidation or a plasma oxidation utilizing oxygen or ozone.

5. A method claimed in claim 1, wherein the metal film is titanium, cobalt or nickel.

6. A method claimed in claim 1, wherein the dummy gate is made of polycrystalline silicon or silicon nitride.

7. A method claimed in claim 1, further comprising between step (b) and step (c) forming an interlayer dielectric film on the obtained substrate, and removing the surface of the interlayer dielectric film being until the anti-silicidation film is exposed.

* * * * *